(12) United States Patent
Muljono et al.

(10) Patent No.: US 8,907,737 B2
(45) Date of Patent: Dec. 9, 2014

(54) APPARATUS, SYSTEM AND METHOD FOR CONFIGURING SIGNAL MODULATION

(71) Applicants: Harry Muljono, San Ramon, CA (US); Donald L. Faw, Hillsboro, OR (US); Charlie Lin, Cupertino, CA (US); Stefan Rusu, Santa Clara, CA (US)

(72) Inventors: Harry Muljono, San Ramon, CA (US); Donald L. Faw, Hillsboro, OR (US); Charlie Lin, Cupertino, CA (US); Stefan Rusu, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 56 days.

(21) Appl. No.: 13/730,629

(22) Filed: Dec. 28, 2012

(65) Prior Publication Data

US 2014/0184349 A1    Jul. 3, 2014

(51) Int. Cl.
*H03K 7/02* (2006.01)

(52) U.S. Cl.
CPC ........................................ *H03K 7/02* (2013.01)
USPC ............................ 332/115; 375/268; 375/353

(58) Field of Classification Search
USPC .................. 332/106, 115, 116; 375/268, 353
See application file for complete search history.

(56) References Cited

U.S. PATENT DOCUMENTS

| | | | |
|---|---|---|---|
| 5,754,353 A * | 5/1998 | Behrens et al. ................. 360/53 |
| 7,283,011 B2 * | 10/2007 | Cohen et al. ................... 332/112 |
| 7,301,417 B2 * | 11/2007 | Shinohara ..................... 332/106 |
| 7,719,374 B2 * | 5/2010 | Kuosmanen ................... 331/175 |
| 8,144,761 B2 * | 3/2012 | Nakasha ........................ 375/238 |
| 2004/0141567 A1 * | 7/2004 | Yang et al. ..................... 375/287 |
| 2013/0243056 A1 * | 9/2013 | Chmelar et al. ............... 375/224 |

* cited by examiner

*Primary Examiner* — Levi Gannon
(74) *Attorney, Agent, or Firm* — Blakely, Sokoloff, Taylor & Zafman LLP

(57) ABSTRACT

Techniques and mechanisms for configuring logic to implement a signal modulation. In an embodiment, the logic includes a finite impulse response (FIR) module comprising circuitry. The selection circuitry may be operable to concurrently receive signals from latch circuitry of the FIR module and, based on the signals, to select an input group of the selection circuitry and to output a voltage identifier. In another embodiment, configuration logic is operable to set an operational mode which determines a total number of concurrent input signals, received by the FIR module, which the FIR module will use to select an input group for generating an output representing a voltage level.

26 Claims, 10 Drawing Sheets

400

410
Detecting connection of a signal source to a FIR module including first selection circuitry and second selection circuitry 420
With an input signal from the signal source, transitioning the FIR module between a first operational mode wherein selection of the first input group and selection of the second input group are each enabled, and a second operational mode wherein selection of the first input group and selection of the second input group are each disabled

FIG. 4

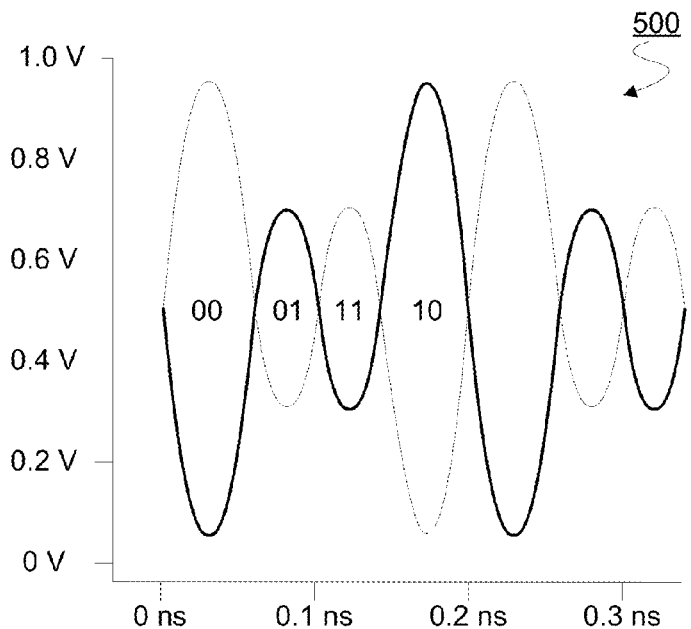

FIG. 5

APPARATUS, SYSTEM AND METHOD FOR CONFIGURING SIGNAL MODULATION

BACKGROUND

1. Technical Field

Embodiments relate generally to signal transmission and more particularly, but not exclusively, to configuring circuit logic for implementing a signal modulation.

2. Background Art

Architectures for next generation processors are expected to rely on circuitry which provides an optical link interface between electrical domain high speed input/output (I/O) links of the processor and optical domain silicon photonic. Such interface circuitry will have to provide for data modulation/demodulation which accommodates optical domain links operating at over twice the speed of electrical domain links.

To date, processors have relied upon gasket chips which implement a 2:1 serializer-deserializer (SerDes) to perform data multiplexing and retiming for data rate conversion. However, among other limitations, gasket chips occupy large amounts of motherboard real estate, add timing latency (~8-10 unit intervals), require around 2-3 W per-channel power consumption and pose motherboard routing complexities due to high speed differential routing. Accordingly, it is desirable to identify data rate conversion mechanisms which are more efficient than those of existing gasket chip hardware.

BRIEF DESCRIPTION OF THE DRAWINGS

The various embodiments of the present invention are illustrated by way of example, and not by way of limitation, in the figures of the accompanying drawings and in which:

FIG. 4 is a flow diagram illustrating elements of a method for configuring signal modulation circuitry according to an embodiment.

FIG. 5 is a graph illustrating elements of a pulse amplitude modulation generated with transmission circuitry according to an embodiment.

DETAILED DESCRIPTION

Embodiments discussed herein variously provide techniques and/or mechanisms for determining an operational mode of signal modulation circuitry. In one embodiment, a device includes a finite impulse response (FIR) module comprising configuration logic to selectively enable functionality to implement, at least in part, pulse amplitude modulation.

Figure 1:
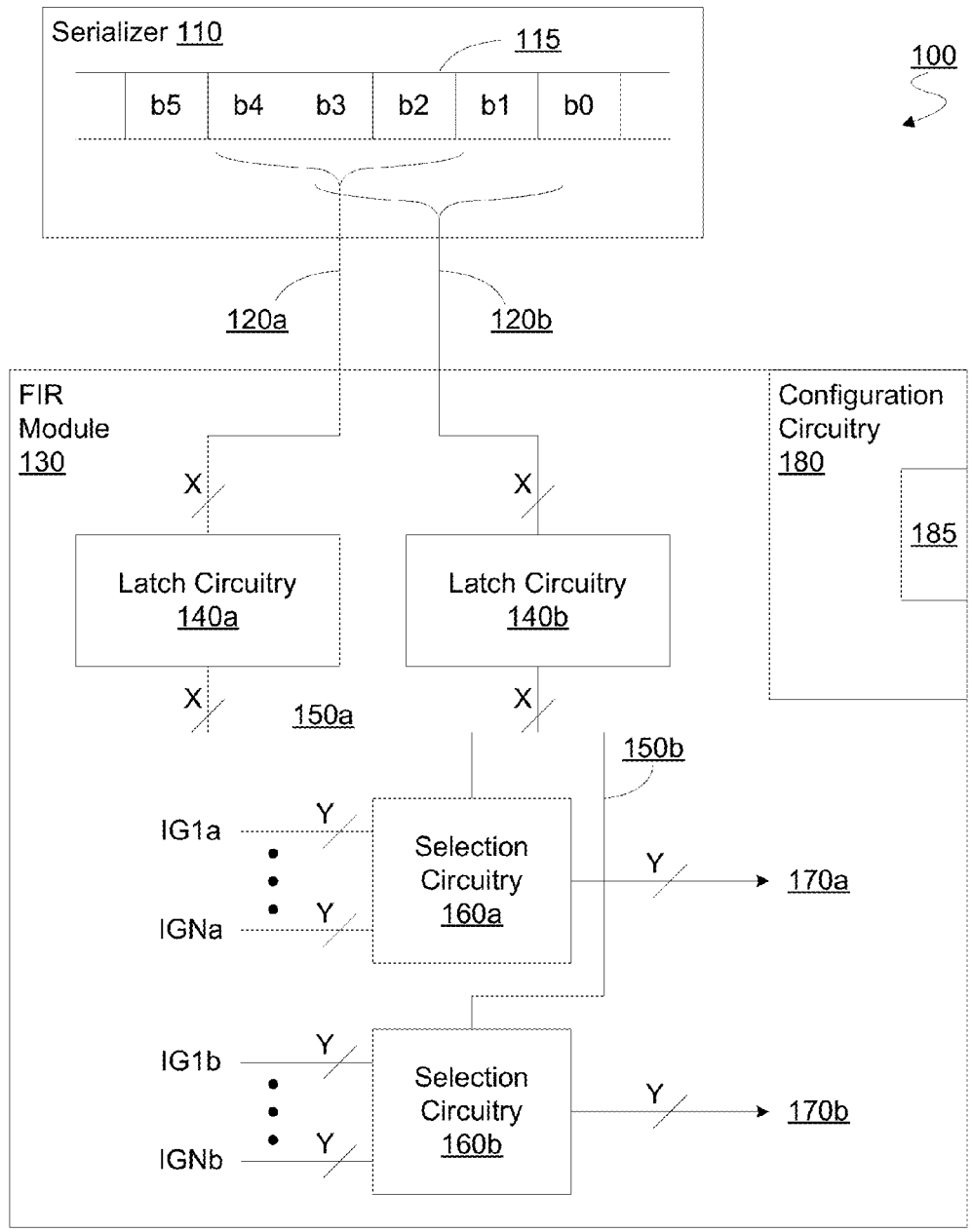
FIG. 1 is a block diagram illustrating elements of a system for configuring a signal modulation mode according to an embodiment.

FIG. 1 illustrates elements of a system 100 for determining a mode to implement signal modulation according to an embodiment. System 100 may include a serializer 110 comprising circuitry to provide one or more signals representing a sequence of bits which, for example, are part of a larger sequence of bits to be represented in a data transmission. In an embodiment, serializer 110 includes load-and-shift circuitry to receive bits from a group of bits arranged in a sequence, where the load-and-shift circuitry is configured to variously shift the loaded bits, in series, along the load-and-shift circuitry. The one or more signals output by serializer 110 may be based on the bits loaded into such load-and-shift circuitry, and on a particular state of shifting of such loaded bits.

By way of illustration and not limitation, system 100 may operate for generation of a modulated signal to represent bits b0, b1, . . . , b5, . . . in the sequence shown in FIG. 1. Serializer 110 may access bits b0, b1, . . . , b5, . . . —e.g. from some data storage, buffer, data stream and/or the like (not shown) included in or coupled to system 100—and generate groups of signals each to represent a different respective component sequence within the larger bit sequence b0, b1, . . . , b5, . . . . For example, serializer 110 may receive bit sequence b0, b1, . . . , b5, . . . via one or more I/O links of a processor.

System 100 may further include a finite impulse response (FIR) module 130 coupled to receive one or more such groups of signals from serializer 130. For example, FIR module 130 may receive input bits 120*a* representing some component sequence of bits, such as component sequence b1, b2, b3. Alternatively or in addition, FIR module 130 may receive input bits 120*b* representing some another component sequence of bits, such as component sequence b2, b3, b4. After a shift of bits by serializer 110, a different component sequence of bits may be represented to FIR module 130—e.g. a component sequence b2, b3, b4 and/or a component sequence b3, b4, b5. In certain embodiments, a total number of the X bits of a component bit sequence which are represented by input bits 120*a* and/or used by to FIR module 130—or a total number of the X bits in input bits 120*b* which are represented to and/or used by FIR module 130—may depend upon a particular operational mode for which FIR module 130 is configured.

FIR module 130 may include latch circuitry 140*a* to receive input bits 120*a* from serializer 110, where based on input bits 120*a*, latch circuitry 140*a* is to provide output signals each to a different respective one of signal lines 150*a*. FIR module 130 may similarly include latch circuitry 140*b* to receive input bits 120*b* from serializer 110, where based on input bits 120*b*, latch circuitry 140*b* is to provide output signals each to a different respective one of signal lines 150*b*. In an embodiment, a total number of the X signals which are output to signal lines 150*a* based on input bits 120*a*—or which are output to signal lines 150*b* based on input bits 120*b*—depends upon a particular operational mode for which FIR module 130 is configured.

In an embodiment, FIR module 130 further comprises selection circuitry 160*a* coupled to receive via signal lines 150*a* the signals output by latch circuitry 140*a* based on the input bits 120*a* which are received concurrently with one another. Alternatively or in addition, FIR module 130 may further comprise selection circuitry 160*b* coupled to receive via signal lines 150*b* the signals output by latch circuitry 140*b* based on the input bits 120*b* which are received concurrently with one another.

Signal lines 150a and signal lines 150b may serve as control signaling to determine, respectively, a selection operation by selection circuitry 160a and a selection operation by selection circuitry 160b. By way of illustration and not limitation, selection circuitry 160a may include a plurality of groups of inputs (or simply "input groups"), where an input group includes multiple inputs of selection circuitry 160a each to variously couple to and receive a respective input signal. A plurality of input groups of selection circuitry 160a is represented by the illustrative input groups IG1a, . . . , IGNa, which each include a respective Y inputs, where Y is some integer (for example, greater than one).

In an embodiment, selection circuitry 160a receives in parallel, e.g. concurrently, the signals output by latch circuitry 140a based on input bits 120a. In response to such signals, selection circuitry 160a may select one of input groups IG1a, . . . , IGNa and provide an output 170a based on the selected input group. For example, selection circuitry 160a may include or otherwise function as a multiplexer—a NY×Y multiplexer, in the example of system 100—where output 170a includes or otherwise represents signals variously received via the respective inputs of the selected input group.

Similarly, selection circuitry 160b may include a plurality of input groups IG1b, . . . , IGNb, which each include a respective Y inputs. Selection circuitry 160b may receive in parallel the signals output by latch circuitry 140b based on input bits 120a and, in response, select one of input groups IG1b, . . . , IGNb. An output 170b may be provided by selection circuitry 160b based on the selected input group—e.g. where output 170b represents signals variously received at respective inputs of the selected input group. In an embodiment, the Y outputs comprising voltage indicator 170a indicate a particular voltage level for representing some or all of input bits 120a, and the Y outputs comprising voltage indicator 170b indicate a particular voltage level for representing some or all of input bits 120b.

FIR module 130 may further comprise configuration circuitry 180 for determining—e.g. setting and/or changing—a particular operational mode of FIR module 130. Determining the operational mode may include configuring one or more components, signal paths or other hardware characteristics of FIR module 130. In an embodiment, configuration circuitry 180 includes or is coupled to an input 185 to receive a configuration signal for configuring a particular operational mode of FIR module 180. Such a configuration signal may activate one or more mechanisms of configuration circuitry 180 which, for some subset—e.g. only a subset—of input groups IG1a, . . . , IGNa, enable or disable selection of each input group of the subset. Alternatively or in addition, such mechanisms of configuration circuitry 180 may, for some subset—e.g. only a subset—of input groups IG1b, . . . , IGNb, enable or disable selection of each input group of the subset.

By way of illustration and not limitation, configuration circuitry 180 may operate to transition FIR module 130 between a first operational mode and a second operational mode. The first operational mode may, for example, be enabling of selection of one of IG1a, . . . , IGNa and enabling of selection of one of IG1b, . . . , IGNb. By contrast, the second operational mode may be disabling of selection of that same one of IG1a, . . . , IGNa and disabling of selection of that same one of IG1b, . . . , IGNb. In an embodiment, transitioning between the first operational mode and the second operational mode enables a functionality which facilitates performance of a particular type of pulse amplitude modulation with FIR module 130.

Figure 2:
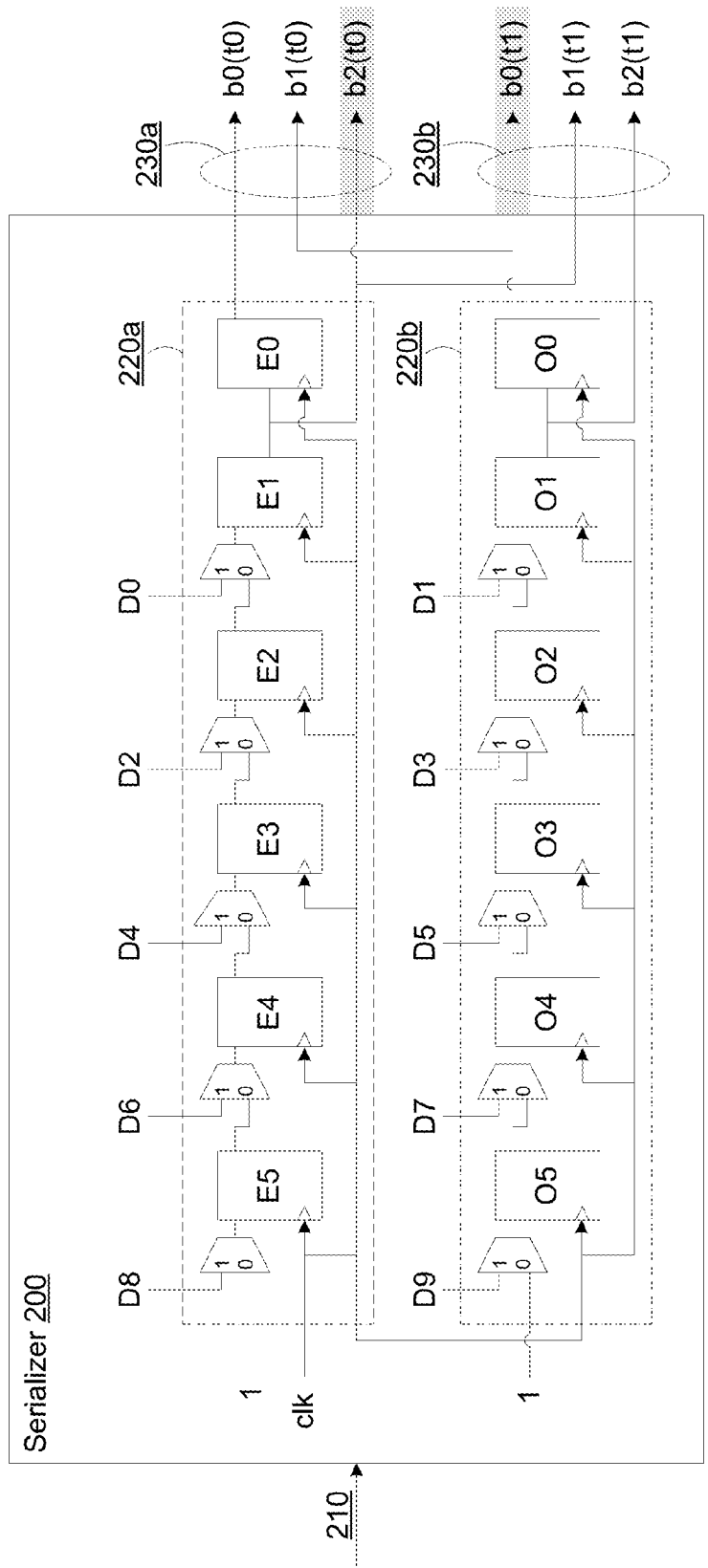
FIG. 2 is a circuit diagram illustrating elements of a serializer according to an embodiment for identifying data to be represented in a signal transmission.

FIG. 2 illustrates elements of a serializer 200 including circuitry for communicating bits to be represented in a modulated transmission according to an embodiment. Serializer 200 may communicate data—such as various component sequences of bit sequence b0, b1, . . . , b5, . . . shown in FIG. 1—to circuitry having some or all of the functionality of FIR module 130. In an embodiment, serializer 200 includes features of serializer 110.

Serializer 200 may receive input 210 including or otherwise representing bits of data logically ordered with respect to one another in a sequence. For example, serializer 200 may include a parallel-in-series-out (PISO) module—e.g. where input 210 includes bits which are received in each via a different respective one of a plurality of parallel input signal lines (not shown) having a logical (in an embodiment, functional). Alternatively or in addition, serializer 200 may receive bits of input 210 in series with one another—e.g. in a data stream from any of a variety of data sources. Certain embodiments are not limited with respect to a manner in which, and/or a source from which, serializer 200 receives input 210.

In an embodiment, serializer 200 includes one or more functional groups of shift circuitry—e.g. where each of the one or more functional groups is to variously receive, and shift in series, respective bits of input 210. For example, input 210 may include a group of bits which are to be represented in a transmission as including a sequence of bits D0, D1, D2, . . . , D8, D9. Any of a variety of additional or alternative sequence of bits may be communicated by input 210.

In an embodiment, serializer 200 includes shift circuitry 220a and shift circuitry 220b each to load respective ones of bits D0, D1, D2, . . . , D8, D9 and to shift such loaded bits in series toward a respective output. By way of illustration and not limitation, shift circuitry 220a may include flip-flops E1, E2 . . . , E5 to receive respective even bits D0, D1, . . . , D8 of D0, D1, D2, . . . , D8, D9, and to shift such even bits out via a flip-flop E0. Alternatively or in addition, shift circuitry 220b may include flip-flops O1, O2 . . . , O5 to receive respective odd bits D1, D3, . . . , D9 of D0, D1, D2, . . . , D8, D9, and to shift such odd bits out via a flip-flop O0. After bits D0, D1, D2, . . . , D8, D9 are variously shift out of respective ones of shift circuitry 220a and shift circuitry 220b, other bits of input 210 may be similarly loaded into, and shifted through, shift circuitry 220a or shift circuitry 220b. Shifting of bits by shift circuitry 220a and/or shift circuitry 220b may be regulated by a clock signal clk, for example. As used herein with reference to bits in a sequence of bits, the term "odd" and "even" refers to bits which are alternate with one another in the sequence.

In an embodiment, serializer provides an output 220a—e.g. a parallel output—which, at a given point in time, includes a component sequence of bit sequence D0, D1, . . . , D8, D9. Serializer may further provide a similar output 220b which, at a given point in time, includes another component sequence of bit sequence D0, D1, . . . , D8, D9. For example, output 220a may represent a sequence of sample bits b0, b1, b2 at a time t0, where bits of bit sequence D0, D1, . . . , D8, D9 are each successively shifted along as sample bits b0, b1, b2. Output 230b may represent the sequence of sample bits b0, b1, b2 at a time t1 after t0, where one shift of D0, D1, . . . , D8, D9 along sample bits b0, b1, b2 takes place between t0 and t1. The number of bits represented in output 230a and/or output 230b are merely illustrative, and are not limiting on certain embodiments.

In an embodiment, bits communicated in parallel with one another in output 230a (or similarly, bits communicated in parallel with one another in output 230b) may be used to determine a voltage level to implement at least in part a modulation scheme. In an embodiment, the number of bits which are so used to determine such a voltage level may depend upon an operational mode of circuitry which includes, or is coupled to, serializer 200. For example, such circuitry may be configurable to operate in either of a first mode and a second mode, where the first mode utilizes all bits of output 230a which are communicated concurrent with one another and/or utilizes all bits of output 230b which are communicated concurrent with one another. By contrast, the second mode may utilize only a subset of such concurrent bits of output 230a and/or only a subset of such concurrent bits of output 230b. By way of illustration and not limitation, a mode of such circuitry may disable utilization of bit b2(t0) in output 230a for determining a respective voltage level, and further disable utilization of bit b0(t1) in output 230b for determining a respective voltage level.

Figure 3:
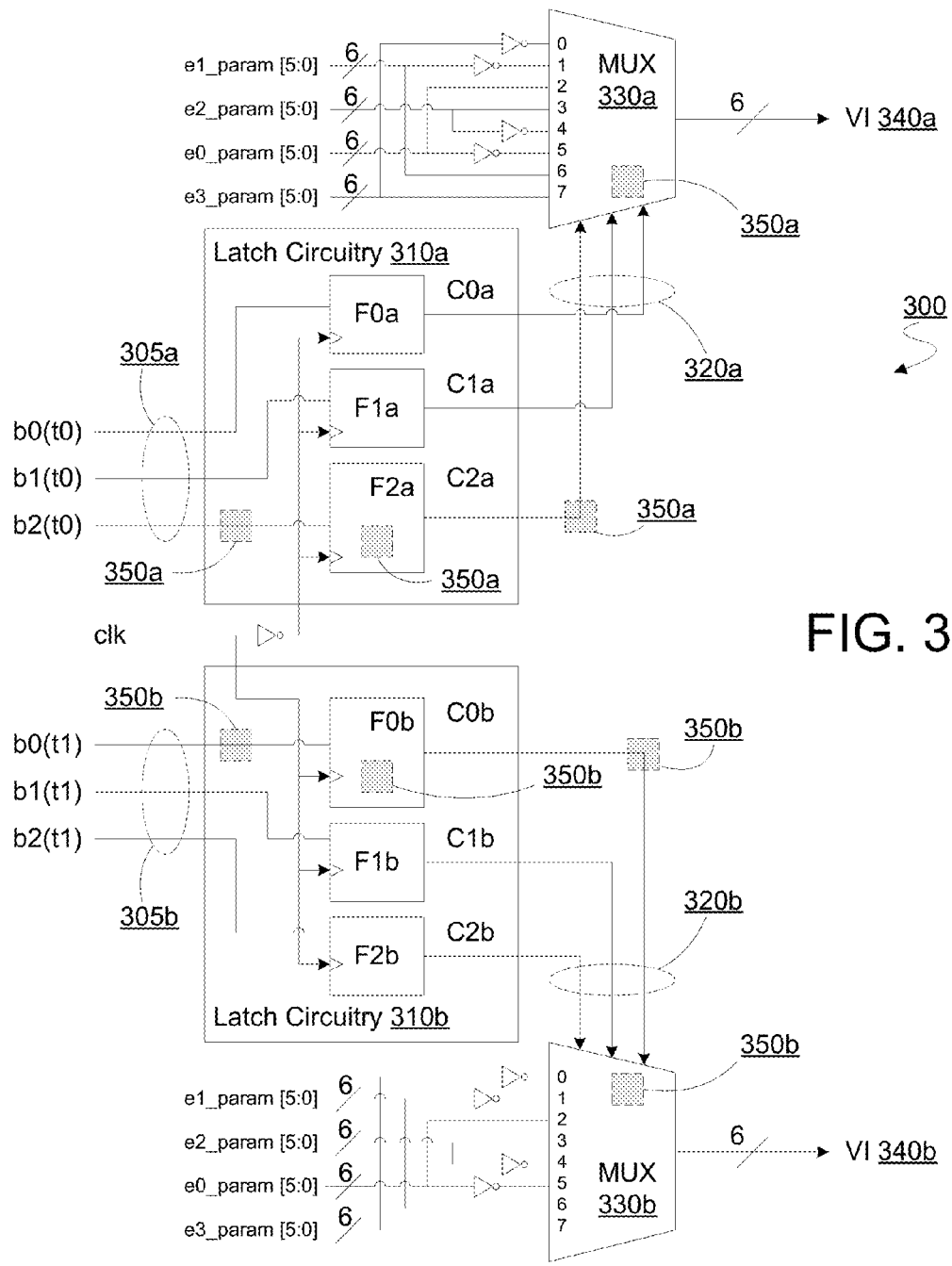
FIG. 3 is a circuit diagram illustrating elements of finite impulse response circuit according to an embodiment for facilitating a signal modulation.

FIG. 3 illustrates elements of a FIR module 300 to determine a modulation for a signal according to an embodiment. FIR module 300 may operate in response to data provided by circuit logic such as that of serializer 200, for example. In an embodiment, FIR module 300 provides some or all of the functionality of FIR module 130.

FIR module 300 may include latch circuitry 310a to receive input 305a representing one bit sequence and latch circuitry 310b to receive input 305b representing another bit sequence. In an embodiment, a larger bit sequence includes the respective bit sequences represented by inputs 305a, 305b. Input 305a may include some or all of the features of output 230a of serializer 200—e.g. where input 305a represents component sequence b0, b1, b2 for a time t0. FIR module 300 may similarly receive input 305b such as some or all of output 230b.

In an embodiment, FIR module 300 includes latch circuitry 310a—e.g. including flip-flops F0a, F1a, F2a—to latch respective values of input 305a, as output signals C0a, C1a, C2a, each to a different respective one of signal lines 320a. FIR module 300 may further include latch circuitry 310b—e.g. including flip-flops F0b, F1b, F2b—to latch respective values of input 305b, as output signals C0b, C1b, C2b, each to a different respective one of signal lines 320b. Latch circuitry 310a and latch circuitry 310b may alternately perform respective latching based on a clock signal clk, in an embodiment.

In an embodiment, FIR module 300 further comprises selection circuitry—e.g. represented by an illustrative multiplexer MUX 330a-coupled to receive via signal lines 320a some or all of the signals concurrently output by latch circuitry 310a based on input 305a. Alternatively or in addition, FIR module 300 may further comprise other selection circuitry—represented by an illustrative MUX 330b—coupled to receive via signal lines 320b some or all of the signals concurrently output by latch circuitry 310b based on input 305b.

MUX 330a may include a plurality of groups of inputs—in the illustrative embodiment of FIR module 300, eight input groups 0 through 7—where logic of MUX 330a selects one such input group based on some or all of C0a, C1a, C2a. Similarly, MUX 330b may include a plurality of groups of inputs—e.g. another eight input groups 0 through 7—where logic of MUX 330b selects one such input group based on some or all of C0b, C1b, C2b. In an embodiment, the input groups 0 through 7 of MUX 330a and the input groups 0 through 7 of MUX 330b are each connected to a respective one of sets of signals e0_param[5:0], e1_param[5:0], e2_param[5:0], e3_param[5:0] which each specify a respective voltage level for use in a modulation scheme. However input groups of either or both of MUX 330a and MUX 330b may be coupled to any of a variety of additional or alternative sets of signals, according to various embodiments. Based on selection of one of its input groups, MUX 330a may provide an output VI 340a which, for example, includes the set of signals received via the selected input group of MUX 330a. MUX 330a may similarly provide an output VI 340b including the set of signals received via the selected input group of MUX 330b.

FIR module 300 may further comprise configuration circuitry operable to disable (or enable), for each of one or more of the input groups of MUX 330a—e.g. only a subset of such input groups—an ability to select the input group for generating any VI 340a. Such configuration circuitry may similarly be operable to additionally or alternatively disable (or enable), for each of one or more of the input groups of MUX 330b, an ability to select the input group for generating any VI 340b.

Operation of such configuration logic is discussed herein with respect to signaling with F2a of latch circuitry 310. However, such discussion may be extended to apply to signaling with any of a variety of combinations of one or more additional or alternative components of latch circuitry 310a. For example, configuration logic may include, or couple to, functional components of FIR module 300 at one or more of locations 350a shown in FIG. 3. Such logic may operate, according to different embodiments, to configure for one of signal lines 320a—e.g. for each signal line in only a subset of signal lines 320a—an invariance of signaling with the signal line for all combinations of data received concurrently as input 305a.

By way of illustration and not limitation, configuration circuitry included in or coupled to one of locations 350a may operate to configure a conductive path between the input for flip-flop F2a and a contact (not shown) which provides an invariant voltage level (a supply voltage Vcc, a ground voltage, etc.) during operation of FIR module 300. Alternatively or in addition, the input for F2a may be disconnected from a serializer or other source which provides the corresponding input signal b2(t0), allowing the input for F2a to float or to be pulled up (or down) to some baseline potential. Alternatively or in addition, such configuration circuitry may configure a conductive path between the output for flip-flop F2a and a contact which provides an invariant voltage level and/or disconnect the output for flip-flop F2a from the corresponding one of signal lines 320a. Alternatively or in addition, such configuration circuitry may disable latching functionality within F2a and or sensor logic of MUX 330a which is otherwise configured to sense C2a being provided via the corresponding line of signal lines 320a. In an embodiment, configuration logic may additionally or alternatively perform the reverse of one or more configuration operations discussed above.

Operation of configuration logic may similarly apply to signaling with any of a variety of combinations of one or more components of latch circuitry 310b. For example, configuration logic may similarly include, or couple to, functional components of FIR module 300 at one or more of locations 350b. Such configuration logic may operate to configure a conductive path between an input of F0b and a contact (not shown) which provides an invariant voltage level during operation of FIR module 300. Alternatively or in addition, such configuration logic may operate to configure a conductive path between an output of F0b and such a contact, to disconnect the input of F0b from a source of signal b0(t1), to disconnect the output of F0b from MUX 330b, to disable latching logic of F0b and/or to disable an input sensor of MUX 330b which is otherwise configured to detect signaling from F0b.

FIG. 4 illustrates elements of a method 400 for determining a configuration of modulation circuitry according to an embodiment. Method 400 may be performed for example, by circuitry which includes a FIR module including some or all of the features of FIR module 130, for example. Alternatively, method 400 may be performed by test, calibration, manufacturing and/or other such equipment which is to couple to such circuitry for setting a configuration of the circuitry.

In an embodiment method 400 includes, at 410, detecting connection of a signal source to a FIR module including first selection circuitry and second selection circuitry. The first selection circuitry may be operable to concurrently receive first signals from first latch circuitry of the FIR module and, based on the first signals, to select one of first input groups of the first selection circuitry and to output a first voltage identifier. The second selection circuitry may be operable to concurrently receive second signals from second latch circuitry of the FIR module and, based on the second signals, to select one of second input groups of the second selection circuitry and to output a second voltage identifier. In an embodiment, a first input group and a second input group belong, respectively, to the first (multiple) input groups and the second (multiple) input groups.

Method 400 may further include, at 420, transitioning the FIR module, with an input signal from the signal source, between a first operational mode wherein selection of the first input group and selection of the second input group are each enabled, and a second operational mode wherein selection of the first input group and selection of the second input group are each disabled.

The transitioning at 420 may include, for example, enabling a pulse amplitude modulation with the FIR module in the second operational mode. For example, the FIR module may transition to the second mode, including reducing a total number of concurrent input signals, received by the FIR module, which the FIR module will use to select an input group for generating an output representing a voltage level. Reducing such a total number may reduce—e.g. halve—the total number of input groups of which are capable of being selected by the first latch circuitry. In an embodiment, reducing the total number of concurrent input signals to be used disables a functionality to facilitate transmit equalization with the FIR module.

FIG. 5 shows a graph 500 illustrates elements of a pulse amplitude modulation performed with signal modulation circuitry configured according to an embodiment. Graph 500 illustrates four (4) level pulse amplitude modulation, wherein pairs of successive bits in a bit sequence are represented as a corresponding one of four possible outputs. In the illustrative case shown in graph 500, the four possible pairs '00', '01', '10' '11' of binary bits each correspond to a different respective output of a differential signal pair, where each signal of the signal differential pair is set at a respective voltage level for representing the particular pair of binary bits.

In an embodiment, a FIR module may be configured—e.g. using method 400—for a mode which enables selection from among only four input groups of latch circuitry, the selection for determining a voltage level to represent a pair of input signals received concurrently by the FIR module. Such selection functionality may enable four-level pulse amplitude modulation with the FIR module. Configuration logic according to an embodiment may provide for the FIR module to be alternatively configured to implement selection from among a larger number of input groups—e.g. for selecting from among additional voltage levels and/or to implement more complicated multiplexing based on input signals received concurrently by the FIR module. Such an alternative configuration may prevent the four-level pulse amplitude modulation functionality—e.g. where the alternative configuration instead enables signal equalization functionality.

Figure 6:
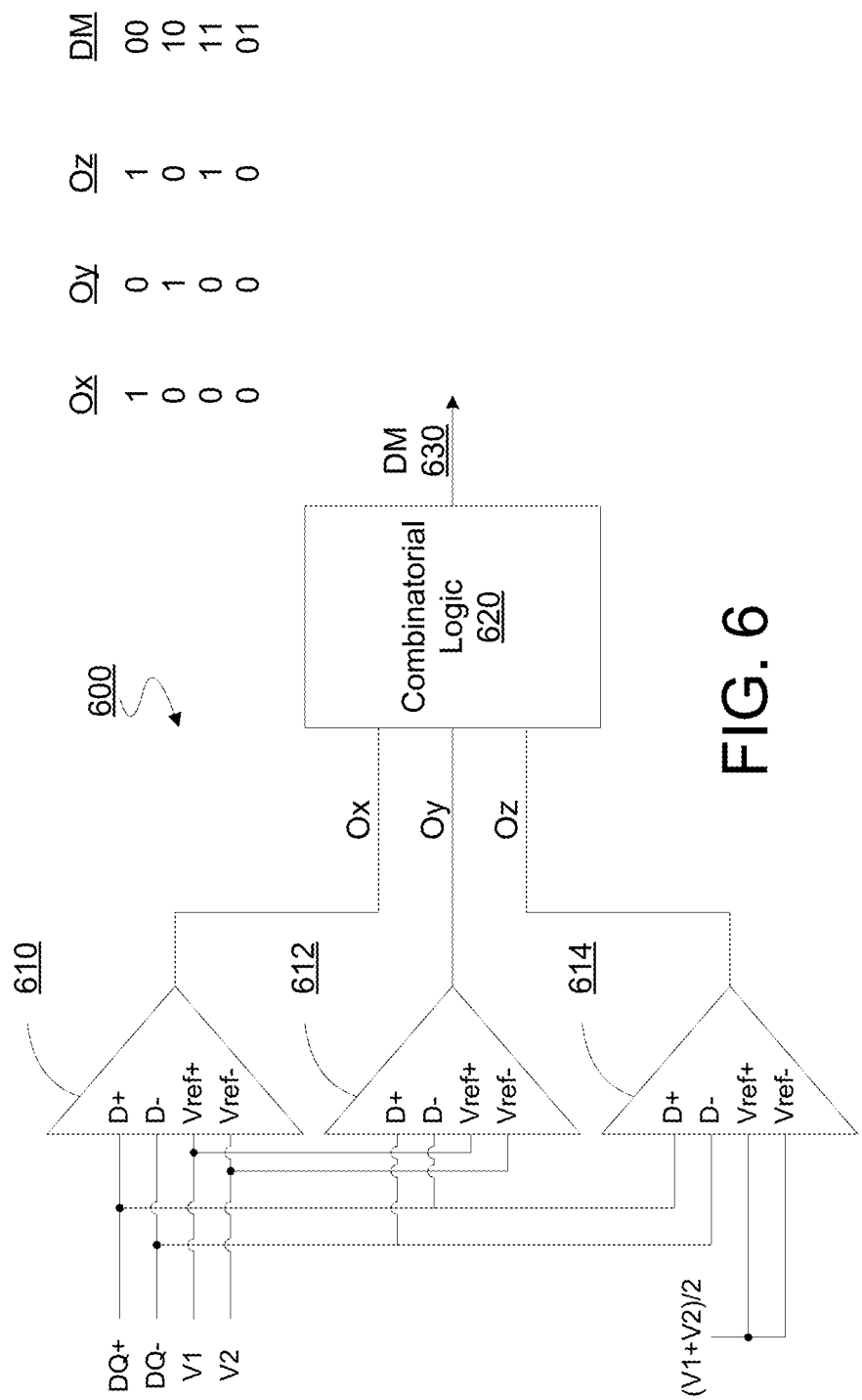
FIG. 6 is a circuit diagram illustrating elements of a receiver circuit to receive a modulated signal according to an embodiment.

FIG. 6 illustrates elements of a receiver circuit 600 according to an embodiment for receiving and demodulating a pulse amplitude modulated signal. Receiver circuit 600 may be included in a device which is configured for communication with another device including system 100, for example. Alternatively, receiver circuit 600 may be included in a device including some or all of the features of system 600.

In an embodiment, receiver circuit 600 includes three high speed amplifiers 610, 612, 614 each to variously receive data signals DQ+, DQ− of a pulse amplitude modulated differential signal pair. Any of a variety of conventional amplifier architectures may be adapted to implement high speed amplifiers 610, 612, 614, according to different embodiments. Data signals DQ+, DQ− may include some or all of the features of the signal represented by graph 500, for example.

Based on the received data signals DQ+, DQ−, high speed amplifiers 610, 612, 614 may provide respective outputs Ox, Oy, Oz each to combinatorial logic 620 of receiver circuit 600. Combinatorial logic 620 may implement a conversion of three respective logical states represented by outputs Ox, Oy, Oz into a result DM 630 representing a demodulated two-bit value of data signals DQ+, DQ−. FIG. 6 further shows a legend representing various conversions of outputs Ox, Oy, Oz into respective values for result DM 630.

Figure 7:
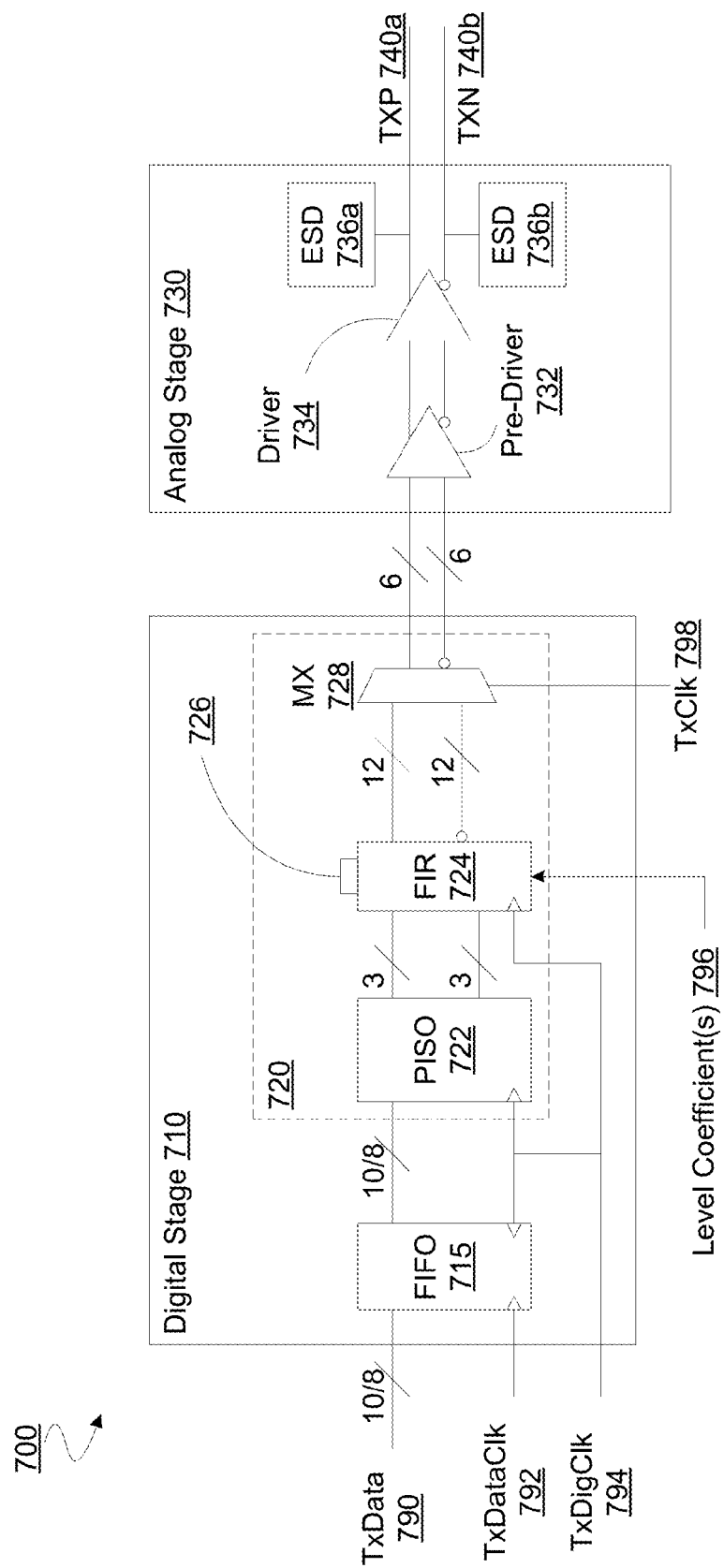
FIG. 7 is a circuit diagram illustrating elements of a transmitter according to an embodiment.

FIG. 7 illustrates elements of a transmitter 700, according to an embodiment, which is configurable for operation in one of multiple modes for variously supporting different signal modulation. Transmitter 700 may include a digital stage 710 to receive digital data TxData 790 which is to be represented in a modulated signal output by transmitter 700. Digital stage 710 may process TxData 790 to variously determine a sequence of voltage levels to be included in the modulated signal. The sequence of voltage levels may be communicated from digital stage 710 to an analog stage 730 of transmitter 700, where analog stage 730, in response, generates transmits analog signals TXP 740a, TXN 740b as a pulse amplitude modulated differential signal pair.

In an embodiment, digital stage 710 includes a first-in-first-out (FIFO) 715 to buffer bits of TxData 790—e.g. where FIFO 715 receives eight (or alternatively, ten) bits in parallel from high speed I/O links of a processor. FIFO 715 may—e.g. under control of a clock TxDataClk 792—output buffered data to circuitry 720 of digital stage 710. In an embodiment, circuitry 720 includes some or all of the features of system 100. By way of illustration and not limitation, a PISO 722 of circuitry 720 may provide some or all of the functionality of serializer 200, and/or FIR 724 of circuitry 720 may provide some or all of the functionality of FIR module 300. In an embodiment, exchanges between some or all of FIFO 715, PISO 722 and FIR 724 may be controlled at least in part by a digital transmit clock TxDigClk 794.

In an embodiment, PISO 722 concurrently provides to FIR 724 signals which represent a sequence of bits which are provided in TxData 790. Based on concurrently received signals, FIR 726 may select a corresponding indicator of a voltage level—e.g. from among voltage level indicators based on level coefficient information 796 provided as an a priori input to FIR 724. FIR 724 may include an input 726—such as input 185—for configuration logic (not shown) to set an operational mode of FIR 724. The selection of a voltage level indicator may be further based on such an operational mode of FIR 724.

In an embodiment, FIR 724 provides selected voltage level indicator to multiplex logic MX 728 of digital stage 710. In the illustrative embodiment of transmitter 700, FIR 724 provides a voltage level indicator as a set of differential signal pairs—e.g. where sets of differential signal pairs are exchanged via different respective sets of signal paths coupled between FIR 724 and MX 728. Based on a control clock TxClk 798, MX 728 may multiplex between such sets of signal paths to successively communicate to analog stage 730 sets of differential signal pairs each representing a respective voltage level.

Any of a variety of conventional analog transmit circuit architectures may be adapted to implement analog stage 730. By way of illustration and not limitation, analog stage 730 may include a pre-driver 732 to convert a group of parallel signals from MX 728—e.g. a set of differential signal pairs—into a differential analog signal pair corresponding to the group of parallel input signals. Analog stage 730 may further include a driver 734 including circuitry to generate analog signals TXP 740*a*, TXN 740*b* based on the output from pre-driver 732. In an embodiment, transmission of TXP 740*a*, TXN 740*b* may be via signal lines coupled to electrostatic discharge protection circuits ESD 736*a*, ESD 736*b*. Certain embodiments are not limited with respect to the particular circuit logic for implementing functionality of analog stage 730.

Figure 8A:
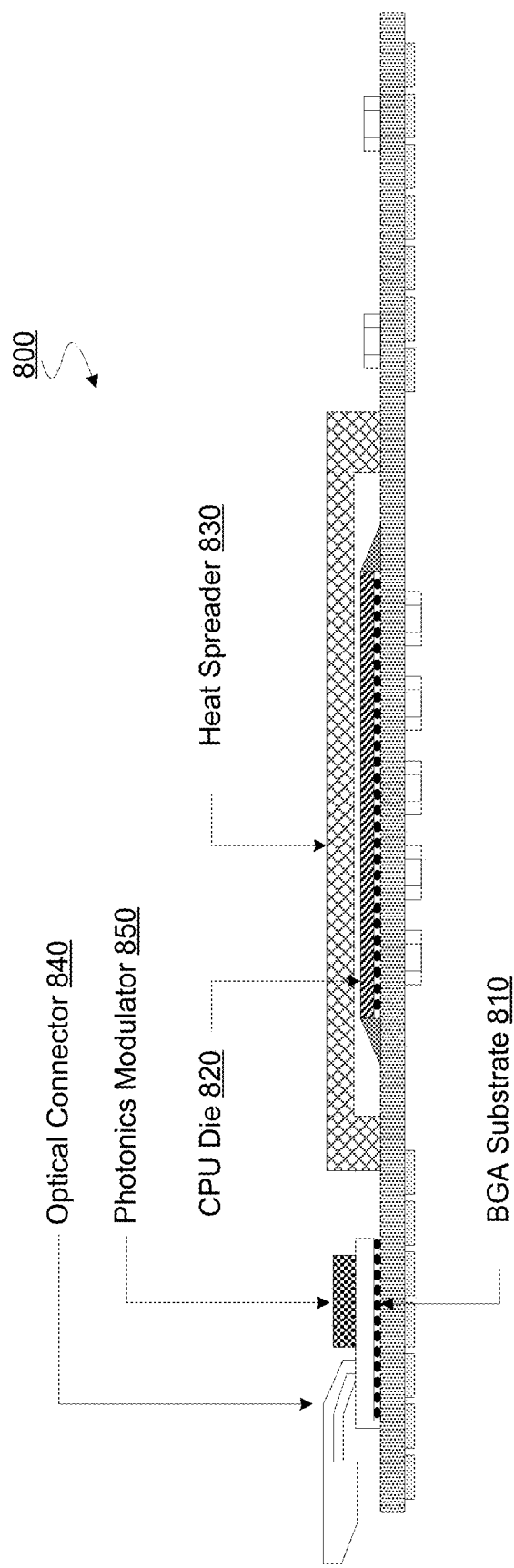
FIGS. 8A and 8B are block diagrams illustrating elements of respective integrated circuit packages to be variously configured for signal modulation according to different embodiments.

FIG. 8A illustrates elements of an integrated circuit (IC) package 800 which is configurable, according to an embodiment, for implementing a signal modulation. IC package 800 may include some or all of the features of system 100 and/or transmitter 700, for example. For example, an operational mode of IC package 800 may be configured based on the techniques of method 400.

In an embodiment, IC package 800 includes a package substrate—represented by an illustrative ball grid array (BGA) substrate 810—to serve as an interposer coupling various components of IC package 800 to one another. A central processing unit (CPU) die 820 of IC package 800 may be mounted on BGA substrate 810—e.g. where one or more other components of IC package 800 are thermally protected from CPU die 820 by a heat spreader 830. During operation of IC package 800, CPU die 820 may to provide, via high speed I/O links (not shown), data which is to be represented in an optical transmission. IC package 800 may further include an optical connector 840 for coupling IC package 800 to an optical fiber (not shown) for implementing such an optical transmission. In an embodiment, signals from CPU die 820 may be converted by a photonics modulator 850 of IC package 800 from electrical domain signaling to optical domain signaling. Photonics modulator 850 may further include demodulation circuitry—e.g. such as receiver circuit 600—for converting optical signals received via optical connector 840 to electrical domain signals.

IC package 800 may include circuitry—e.g. in photonics modulator 850—which is configurable to operate in a mode which facilitates pulse amplitude modulation for electrical-to-optical domain signal conversion. By way of illustration and not limitation, photonics modulator 850 may include some or all of the features of system 100. In embodiment, such circuitry may be readily adapted for other applications which do not include conversion between electrical-domain signaling and optical-domain signaling. By way of illustration and not limitation, such circuitry may be set in (or remain in) a configuration which provides transmit equalization functionality. Such transmit equalization may be used, for example, in high speed differential signaling between components of a CPU die and/or between a CPU die and another component of IC package 800.

Figure 8B:
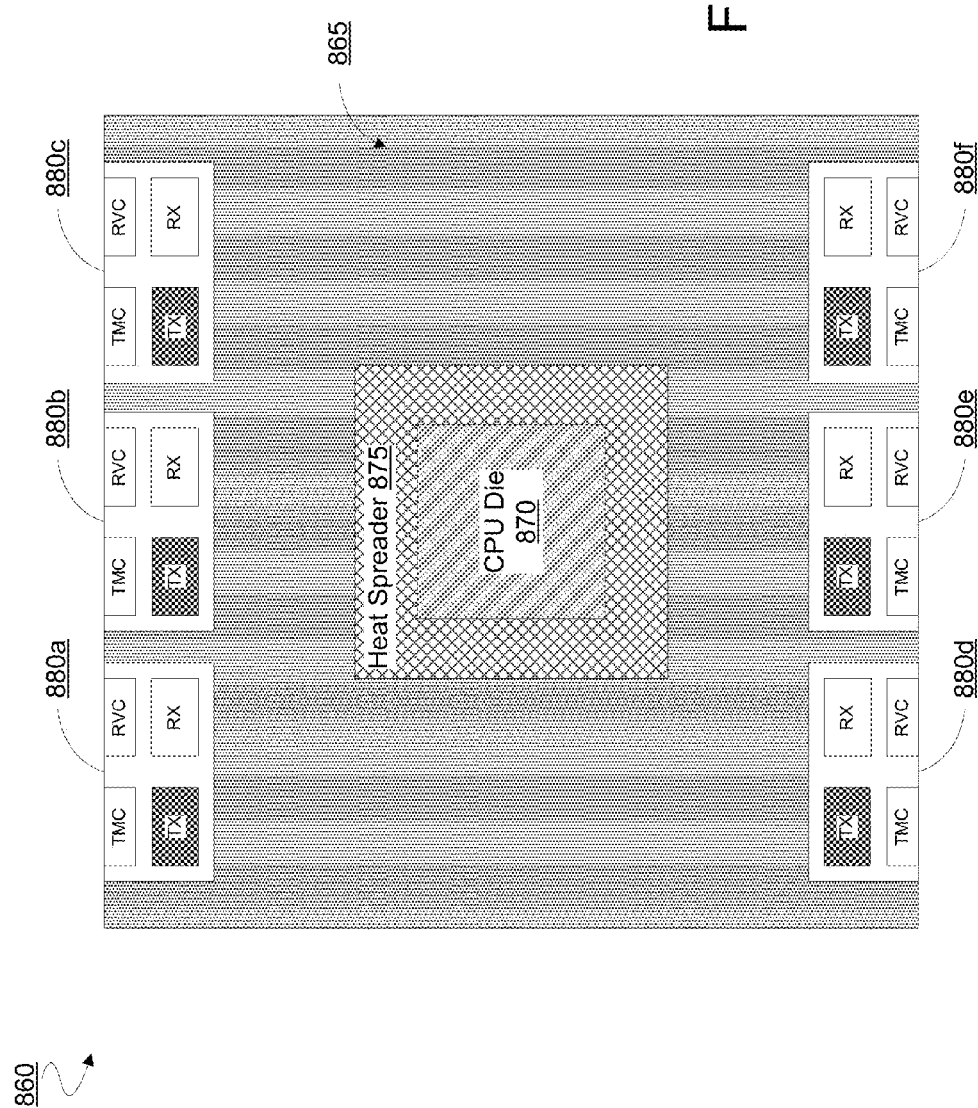

FIG. 8B illustrates elements of an integrated circuit (IC) package 860 which is configurable, according to an embodiment, for implementing various types of signal modulation. In an embodiment, IC package 860 provides some or all of the functionality of IC package 800. IC package 860 may include multiple groups of circuit logic which each variously include features of system 100 and/or transmitter 700, for example.

In an embodiment, IC package 860 includes a package substrate 865 and a CPU die 870 mounted on package substrate 865—e.g. where one or more other components of IC package 860 are thermally protected from CPU die 870 by a heat spreader 875. IC package 860 may include multiple groups of communication hardware—e.g. including some or all of the illustrative groups 880*a*, 880*b*, 880*c*, 880*d*, 880*e*, 880*f*—which are variously coupled to CPU die 865 and with which IC package 860 may further couple to various electrical and/or optical communication media. For example, one or more such groups of communication hardware may each include a respective transmit connector TMC and, in an embodiment, a respective receive connector RVC for IC package 865 to communicate with other circuitry (not shown). Some or all hardware of a transmit connector TMC and a receive connector RVC may be integrated together, although certain embodiments are not limited in this regard.

Groups of communication hardware of IC package 860 may each further include respective transmitter circuitry TX for variously transmitting data via a respective transmit connector TMC and/or respective receiver circuitry RX for receiving data via a respective receive connector RVC. In an embodiment, multiple ones of the transmitter circuitry TX of IC package 860 are independently configurable to variously support any of multiple signal modulation schemes.

For example, the respective transmitter circuitry TX of groups 880*a*, 880*b*, 880*c*, 880*d*, 880*e*, 880*f* may each provide the functionality of system 100, for example. With such functionality, transmitter circuitry TX of certain groups may be configured to implement four-level pulse amplitude modulation to provide data rate conversion for optical communication, whereas transmitter circuitry TX of certain other groups may be differently configured to instead implement a transmit equalization functionality for modulation other than 4-level pulse amplitude modulation.

Such configuration capability may facilitate integration of IC package 860 into a computer platform or other system, wherein some of groups 880*a*, 880*b*, 880*c*, 880*d*, 880*e*, 880*f* are each to couple IC package 860 to respective electrical communication media, and others of groups 880*a*, 880*b*, 880*c*, 880*d*, 880*e*, 880*f* are each to couple IC package 860 to respective optical communication media. For such an integration, transmitter circuitry TX of IC package 860 may be variously configured at any of a variety of points—e.g. during fabrication and/or testing of IC package 860 and/or during assembly of the system which is to include IC package 860.

Figure 9:
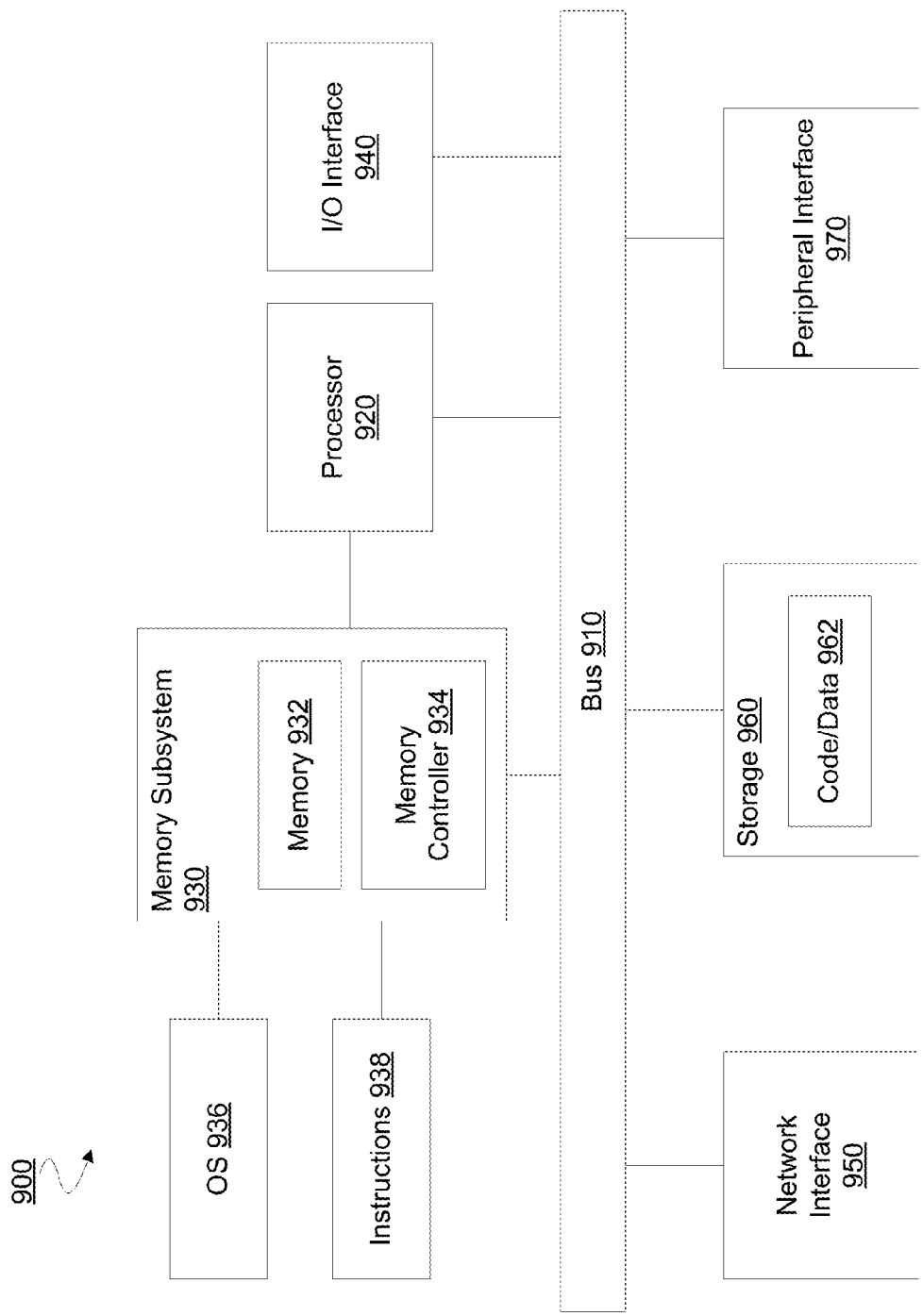
FIG. 9 is a block diagram illustrating elements of a computing system to determine a configuration for signal modulation according to an embodiment.

FIG. 9 is a block diagram of an embodiment of a computing system in which command/address bus communications may be implemented. System 900 represents a computing device in accordance with any embodiment described herein, and may be a laptop computer, a desktop computer, a server, a gaming or entertainment control system, a scanner, copier, printer, or other electronic device. System 900 may include processor 920, which provides processing, operation management, and execution of instructions for system 900. Processor 920 may include any type of microprocessor, central processing unit (CPU), processing core, or other processing hardware to provide processing for system 900. Processor 920 controls the overall operation of system 900, and may be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 930 represents the main memory of system 900, and provides temporary storage for code to be executed by processor 920, or data values to be used in executing a routine. Memory subsystem 930 may include one or more memory devices such as read-only memory (ROM), flash memory, one or more varieties of random access memory (RAM), or other memory devices, or a combination of such devices. Memory subsystem 930 stores and hosts, among other things, operating system (OS) 936 to provide a software platform for execution of instructions in system 900. Additionally, other instructions 938 are stored and executed from memory subsystem 930 to provide the logic and the processing of system 900. OS 936 and instructions 938 are executed by processor 920.

Memory subsystem 930 may include memory device 932 where it stores data, instructions, programs, or other items. In one embodiment, memory subsystem includes memory controller 934, which supports access to memory device 932 by processor 920. Processor 920 and memory subsystem 930 are coupled to bus/bus system 910. Bus 910 is an abstraction that represents any one or more separate physical buses, communication lines/interfaces, and/or point-to-point connections, connected by appropriate bridges, adapters, and/or controllers. Therefore, bus 910 may include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 910 may also correspond to interfaces in network interface 950.

System 900 may also include one or more input/output (I/O) interface(s) 940, network interface 950, one or more internal mass storage device(s) 960, and peripheral interface 970 coupled to bus 910. I/O interface 940 may include one or more interface components through which a user interacts with system 900 (e.g., video, audio, and/or alphanumeric interfacing). Network interface 950 provides system 900 the ability to communicate with remote devices (e.g., servers, other computing devices) over one or more networks. Network interface 950 may include an Ethernet adapter, wireless interconnection components, USB (universal serial bus), or other wired or wireless standards-based or proprietary interfaces.

Storage 960 may be or include any conventional medium for storing large amounts of data in a nonvolatile manner, such as one or more magnetic, solid state, or optical based disks, or a combination. Storage 960 holds code or instructions and data 962 in a persistent state (i.e., the value is retained despite interruption of power to system 900). Storage 960 may be generically considered to be a "memory," although memory 930 is the executing or operating memory to provide instructions to processor 920. Whereas storage 960 is nonvolatile, memory 930 may include volatile memory (i.e., the value or state of the data is indeterminate if power is interrupted to system 900).

Peripheral interface 970 may include any hardware interface not specifically mentioned above. Peripherals refer generally to devices that connect dependently to system 900. A dependent connection is one where system 900 provides the software and/or hardware platform on which operation executes, and with which a user interacts.

Figure 10:
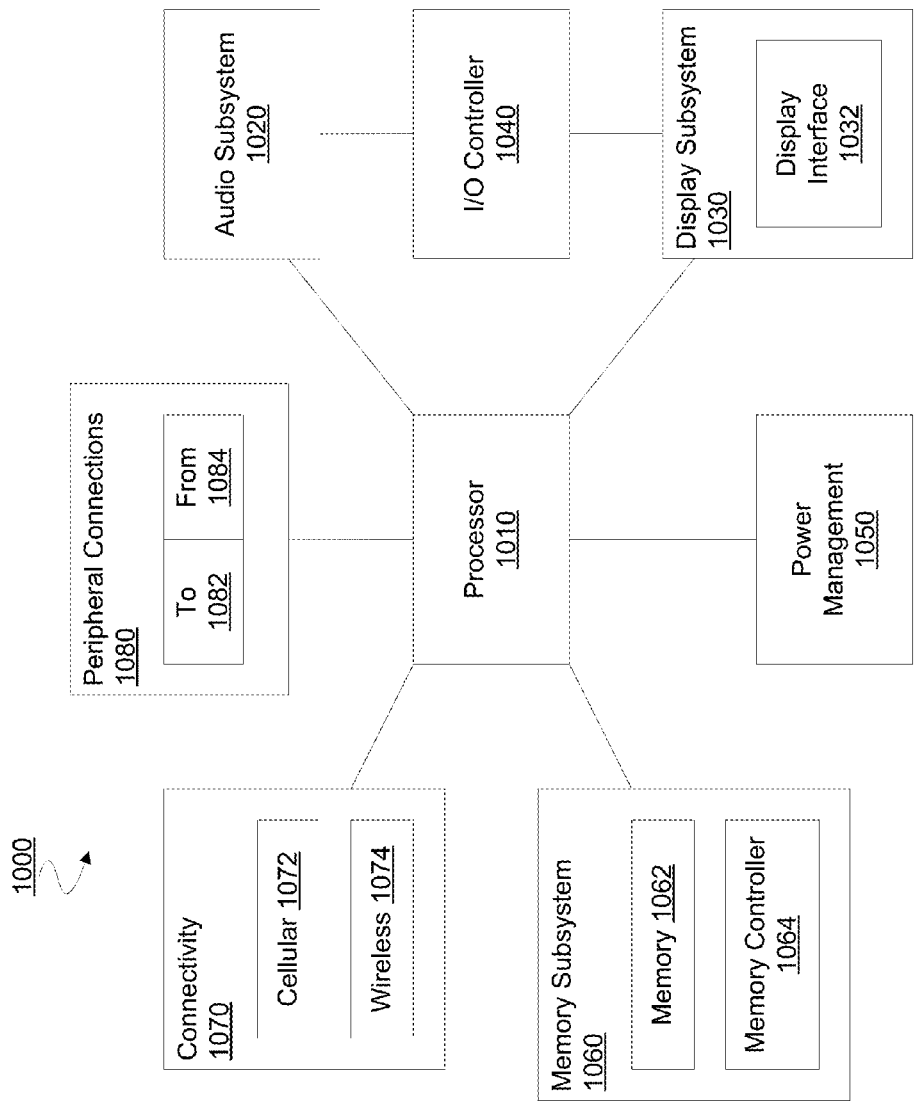
FIG. 10 is a block diagram illustrating elements of a mobile device to determine a configuration for signal modulation according to an embodiment.

FIG. 10 is a block diagram of an embodiment of a mobile device in which command/address communications may be implemented. Device 1000 represents a mobile computing device, such as a computing tablet, a mobile phone or smartphone, a wireless-enabled e-reader, or other mobile device. It will be understood that certain of the components are shown generally, and not all components of such a device are shown in device 1000.

Device 1000 may include processor 1010, which performs the primary processing operations of device 1000. Processor 1010 may include one or more physical devices, such as microprocessors, application processors, microcontrollers, programmable logic devices, or other processing means. The processing operations performed by processor 1010 include the execution of an operating platform or operating system on which applications and/or device functions are executed. The processing operations include operations related to I/O (input/output) with a human user or with other devices, operations related to power management, and/or operations related to connecting device 1000 to another device. The processing operations may also include operations related to audio I/O and/or display I/O.

In one embodiment, device 1000 includes audio subsystem 1020, which represents hardware (e.g., audio hardware and audio circuits) and software (e.g., drivers, codecs) components associated with providing audio functions to the computing device. Audio functions may include speaker and/or headphone output, as well as microphone input. Devices for such functions may be integrated into device 1000, or connected to device 1000. In one embodiment, a user interacts with device 1000 by providing audio commands that are received and processed by processor 1010.

Display subsystem 1030 represents hardware (e.g., display devices) and software (e.g., drivers) components that provide a visual and/or tactile display for a user to interact with the computing device. Display subsystem 1030 may include display interface 1032, which may include the particular screen or hardware device used to provide a display to a user. In one embodiment, display interface 1032 includes logic separate from processor 1010 to perform at least some processing related to the display. In one embodiment, display subsystem 1030 includes a touchscreen device that provides both output and input to a user.

I/O controller 1040 represents hardware devices and software components related to interaction with a user. I/O controller 1040 may operate to manage hardware that is part of audio subsystem 1020 and/or display subsystem 1030. Additionally, I/O controller 1040 illustrates a connection point for additional devices that connect to device 1000 through which a user might interact with the system. For example, devices that may be attached to device 1000 might include microphone devices, speaker or stereo systems, video systems or other display device, keyboard or keypad devices, or other I/O devices for use with specific applications such as card readers or other devices.

As mentioned above, I/O controller 1040 may interact with audio subsystem 1020 and/or display subsystem 1030. For example, input through a microphone or other audio device may provide input or commands for one or more applications or functions of device 1000. Additionally, audio output may be provided instead of or in addition to display output. In another example, if display subsystem includes a touchscreen, the display device also acts as an input device, which may be at least partially managed by I/O controller 1040.

There may also be additional buttons or switches on device 1000 to provide I/O functions managed by I/O controller 1040.

In one embodiment, I/O controller 1040 manages devices such as accelerometers, cameras, light sensors or other environmental sensors, gyroscopes, global positioning system (GPS), or other hardware that may be included in device 1000. The input may be part of direct user interaction, as well as providing environmental input to the system to influence its operations (such as filtering for noise, adjusting displays for brightness detection, applying a flash for a camera, or other features).

In one embodiment, device 1000 includes power management 1050 that manages battery power usage, charging of the battery, and features related to power saving operation. Memory subsystem 1060 may include memory device(s) 1062 for storing information in device 1000. Memory subsystem 1060 may include nonvolatile (state does not change if power to the memory device is interrupted) and/or volatile (state is indeterminate if power to the memory device is interrupted) memory devices. Memory 1060 may store application data, user data, music, photos, documents, or other data, as well as system data (whether long-term or temporary) related to the execution of the applications and functions of system 1000.

In one embodiment, memory subsystem 1060 includes memory controller 1064 (which could also be considered part of the control of system 1000, and could potentially be considered part of processor 1010). Memory controller 1064 may exchange communications with memory 1062 via a command/address bus (not shown). In an embodiment, memory controller 1064 sends a command to memory 1062, where portions of the command are sent in succession based on an operating mode of memory 1062.

Connectivity 1070 may include hardware devices (e.g., wireless and/or wired connectors and communication hardware) and software components (e.g., drivers, protocol stacks) to enable device 1000 to communicate with external devices. The device could be separate devices, such as other computing devices, wireless access points or base stations, as well as peripherals such as headsets, printers, or other devices.

Connectivity 1070 may include multiple different types of connectivity. To generalize, device 1000 is illustrated with cellular connectivity 1072 and wireless connectivity 1074. Cellular connectivity 1072 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 1074 refers to wireless connectivity that is not cellular, and may include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 1080 include hardware interfaces and connectors, as well as software components (e.g., drivers, protocol stacks) to make peripheral connections. It will be understood that device 1000 could both be a peripheral device ("to" 1082) to other computing devices, as well as have peripheral devices ("from" 1084) connected to it. Device 1000 commonly has a "docking" connector to connect to other computing devices for purposes such as managing (e.g., downloading and/or uploading, changing, synchronizing) content on device 1000. Additionally, a docking connector may allow device 1000 to connect to certain peripherals that allow device 1000 to control content output, for example, to audiovisual or other systems.

In addition to a proprietary docking connector or other proprietary connection hardware, device 1000 may make peripheral connections 1080 via common or standards-based connectors. Common types may include a Universal Serial Bus (USB) connector (which may include any of a number of different hardware interfaces), DisplayPort including MiniDisplayPort (MDP), High Definition Multimedia Interface (HDMI), Firewire, or other type.

In one aspect, an apparatus comprises a finite impulse response (FIR) module including first latch circuitry to output first signals representing a first bit sequence, second latch circuitry to output second signals representing a second bit sequence, wherein a third bit sequence includes the first bit sequence and the second bit sequence, and first selection circuitry including first input groups, the first selection circuitry to concurrently receive the first signals and, based on the first signals, to select one of the first input groups and to output a first voltage identifier. The FIR module further comprises second selection circuitry including second input groups, the second selection circuitry to concurrently receive the second signals and, based on the second signals, to select one of the second input groups and to output a second voltage identifier. The FIR module further comprises configuration circuitry to receive an input signal and, in response, to transition the FIR module between a first operational mode wherein selection of the first input group and selection of the second input group are each enabled, and a second operational mode wherein selection of the first input group and selection of the second input group are each disabled.

In an embodiment, the configuration circuitry to transition the FIR module between the first operational mode and the second operational mode includes the configuration circuitry to enable a pulse amplitude modulation with the FIR module in the second operational mode. In another embodiment, the configuration circuitry to enable the pulse amplitude modulation includes the configuration circuitry to disable a transmit equalization with the FIR module. In another embodiment, the pulse amplitude modulation includes four level pulse amplitude modulation. In another embodiment, the configuration circuitry to transition the FIR module between the first operational mode and the second operational mode includes the configuration circuitry to configure a conductive path between an input of the first latch circuitry and a contact for providing an invariant voltage level.

In another embodiment, the configuration circuitry to transition the FIR module between the first operational mode and the second operational mode includes the configuration circuitry to configure a conductive path between an output of the first latch circuitry and a contact for providing an invariant voltage level. In another embodiment, the first latch circuitry includes a first latch, wherein the configuration circuitry to transition the FIR module between the first operational mode and the second operational mode includes the configuration circuitry to disable the first latch. In another embodiment, the first selection circuitry includes an input sensor to detect one of the first signals, wherein the configuration circuitry to transition the FIR module between the first operational mode and the second operational mode includes the configuration circuitry to disable the input sensor. In another embodiment, the apparatus further comprises serializer circuitry coupled to the FIR module, the serializer circuitry to output bits of the first bit sequence to the first latch circuitry and to output bits of the second bit sequence to the second latch circuitry, the serializer circuitry including a first shift circuit to shift even bits of the third bit sequence, and a second shift circuit to shift odd bits of the third bit sequence.

In another aspect, a system comprises a finite impulse response (FIR) module including first latch circuitry to output first signals representing a first bit sequence, second latch circuitry to output second signals representing a second bit sequence, wherein a third bit sequence includes the first bit sequence and the second bit sequence, and first selection circuitry including first input groups, the first selection circuitry to concurrently receive the first signals and, based on the first signals, to select one of the first input groups and to output a first voltage identifier. The FIR module further comprises second selection circuitry including second input groups, the second selection circuitry to concurrently receive the second signals and, based on the second signals, to select one of the second input groups and to output a second voltage identifier. The FIR module further comprises configuration circuitry to receive an input signal and, in response, to transition the FIR module between a first operational mode wherein selection of the first input group and selection of the second input group are each enabled, and a second operational mode wherein selection of the first input group and selection of the second input group are each disabled. The system further comprises a touchscreen display device configured to provide a user display representing data to be transmitted with the FIR module.

In an embodiment, the configuration circuitry to transition the FIR module between the first operational mode and the second operational mode includes the configuration circuitry to enable a pulse amplitude modulation with the FIR module in the second operational mode. In another embodiment, the configuration circuitry to enable the pulse amplitude modulation includes the configuration circuitry to disable a transmit equalization with the FIR module. In another embodiment, the pulse amplitude modulation includes four level pulse amplitude modulation. In another embodiment, the configuration circuitry to transition the FIR module between the first operational mode and the second operational mode includes the configuration circuitry to configure a conductive path between an input of the first latch circuitry and a contact for providing an invariant voltage level.

In another embodiment, the configuration circuitry to transition the FIR module between the first operational mode and the second operational mode includes the configuration circuitry to configure a conductive path between an output of the first latch circuitry and a contact for providing an invariant voltage level. In another embodiment, the first latch circuitry includes a first latch, wherein the configuration circuitry to transition the FIR module between the first operational mode and the second operational mode includes the configuration circuitry to disable the first latch. In another embodiment, the first selection circuitry includes an input sensor to detect one of the first signals, wherein the configuration circuitry to transition the FIR module between the first operational mode and the second operational mode includes the configuration circuitry to disable the input sensor. In another embodiment, the system of claim 10, further comprises serializer circuitry coupled to the FIR module, the serializer circuitry to output bits of the first bit sequence to the first latch circuitry and to output bits of the second bit sequence to the second latch circuitry, the serializer circuitry including a first shift circuit to shift even bits of the third bit sequence, and a second shift circuit to shift odd bits of the third bit sequence.

In another aspect, a method comprises detecting connection of a signal source to a finite impulse response (FIR) module including first selection circuitry and second selection circuitry, and with an input signal from the signal source, transitioning the FIR module between a first operational mode wherein selection of a first input group of the first selection circuitry and selection of a second input group of the second selection circuitry are each enabled, and a second operational mode wherein selection of the first input group and selection of the second input group are each disabled. The first selection circuitry is configured to concurrently receive first signals from first latch circuitry of the FIR module and, based on the first signals, to select one of first input groups of the first selection circuitry and to output a first voltage identifier. The second selection circuitry is configured to concurrently receive second signals from second latch circuitry of the FIR module and, based on the second signals, to select one of second input groups of the second selection circuitry and to output a second voltage identifier.

In an embodiment, transitioning the FIR module between the first operational mode and the second operational mode includes enabling a pulse amplitude modulation with the FIR module in the second operational mode. In another embodiment, enabling the pulse amplitude modulation includes disabling a transmit equalization with the FIR module. In another embodiment, transitioning the FIR module between the first operational mode and the second operational mode includes configuring a conductive path between an input of the first latch circuitry and a contact for providing an invariant voltage level. In another embodiment, transitioning the FIR module between the first operational mode and the second operational mode includes configuring a conductive path between an output of the first latch circuitry and a contact for providing an invariant voltage level. In another embodiment, the first latch circuitry includes a first latch, wherein transitioning the FIR module between the first operational mode and the second operational mode includes disabling the first latch. In another embodiment, the first selection circuitry includes an input sensor to detect one of the first signals, wherein transitioning the FIR module between the first operational mode and the second operational mode includes disabling the input sensor.

In another aspect, a computer-readable storage medium has stored thereon instructions which, when executed by one or more processing units, cause the one or more processing units to perform a method comprising detecting connection of a signal source to a finite impulse response (FIR) module including first selection circuitry and second selection circuitry, with an input signal from the signal source, transitioning the FIR module between a first operational mode wherein selection of the first input group and selection of the second input group are each enabled, and a second operational mode wherein selection of the first input group and selection of the second input group are each disabled. The first selection circuitry is configured to concurrently receive first signals from first latch circuitry of the FIR module and, based on the first signals, to select one of the first input groups and to output a first voltage identifier. The second selection circuitry is configured to concurrently receive second signals from second latch circuitry of the FIR module and, based on the second signals, to select one of the second input groups and to output a second voltage identifier.

In an embodiment, transitioning the FIR module between the first operational mode and the second operational mode includes enabling a pulse amplitude modulation with the FIR module in the second operational mode. In another embodiment, enabling the pulse amplitude modulation includes disabling a transmit equalization with the FIR module. In another embodiment, transitioning the FIR module between the first operational mode and the second operational mode includes configuring a conductive path between an input of the first latch circuitry and a contact for providing an invariant voltage level. In another embodiment, transitioning the FIR module between the first operational mode and the second operational mode includes configuring a conductive path between an output of the first latch circuitry and a contact for providing an invariant voltage level.

Techniques and architectures for configuring signal modulation circuitry are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An apparatus comprising: a finite impulse response (FIR) module including:
    first latch circuitry to output first signals representing a first bit sequence;
    second latch circuitry to output second signals representing a second bit sequence, wherein a third bit sequence includes the first bit sequence and the second bit sequence;
    first selection circuitry including first input groups, the first selection circuitry to concurrently receive the first signals and, based on the first signals, to select one of the first input groups and to output a first voltage identifier;
    second selection circuitry including second input groups, the second selection circuitry to concurrently receive the second signals and, based on the second signals, to select one of the second input groups and to output a second voltage identifier; and
    configuration circuitry to receive an input signal and, in response, to transition the FIR module between a first operational mode wherein selection of the first input group and selection of the second input group are each enabled, and a second operational mode wherein selection of the first input group and selection of the second input group are each disabled, wherein the configuration circuitry to transition the FIR module between the first operational mode and the second operational mode includes the configuration circuitry to enable a pulse amplitude modulation with the FIR module in the second operational mode.

2. The apparatus of claim 1, wherein the configuration circuitry to enable the pulse amplitude modulation includes the configuration circuitry to disable a transmit equalization with the FIR module.

3. The apparatus of claim 1, wherein the pulse amplitude modulation includes four level pulse amplitude modulation.

4. The apparatus of claim 1, wherein the configuration circuitry to transition the FIR module between the first operational mode and the second operational mode includes the configuration circuitry to configure a conductive path between an input of the first latch circuitry and a contact for providing an invariant voltage level.

5. The apparatus of claim 1, wherein the configuration circuitry to transition the FIR module between the first operational mode and the second operational mode includes the configuration circuitry to configure a conductive path between an output of the first latch circuitry and a contact for providing an invariant voltage level.

6. The apparatus of claim 1, wherein the first latch circuitry includes a first latch and wherein the configuration circuitry to transition the FIR module between the first operational mode and the second operational mode includes the configuration circuitry to disable the first latch.

7. The apparatus of claim 1, wherein the first selection circuitry includes an input sensor to detect one of the first signals, and wherein the configuration circuitry to transition the FIR module between the first operational mode and the second operational mode includes the configuration circuitry to disable the input sensor.

8. The apparatus of claim 1, further comprising:
serializer circuitry coupled to the FIR module, the serializer circuitry to output bits of the first bit sequence to the first latch circuitry and to output bits of the second bit sequence to the second latch circuitry, the serializer circuitry including:
a first shift circuit to shift even bits of the third bit sequence; and
a second shift circuit to shift odd bits of the third bit sequence.

9. A system comprising:
a finite impulse response (FIR) module including:
first latch circuitry to output first signals representing a first bit sequence;
second latch circuitry to output second signals representing a second bit sequence, wherein a third bit sequence includes the first bit sequence and the second bit sequence;
first selection circuitry including first input groups, the first selection circuitry to concurrently receive the first signals and, based on the first signals, to select one of the first input groups and to output a first voltage identifier;
second selection circuitry including second input groups, the second selection circuitry to concurrently receive the second signals and, based on the second signals, to select one of the second input groups and to output a second voltage identifier; and
configuration circuitry to receive an input signal and, in response, to transition the FIR module between a first operational mode wherein selection of the first input group and selection of the second input group are each enabled, and a second operational mode wherein selection of the first input group and selection of the second input group are each disabled, wherein the configuration circuitry to transition the FIR module between the first operational mode and the second operational mode includes the configuration circuitry to enable a pulse amplitude modulation with the FIR module in the second operational mode; and
a touchscreen display device configured to provide a user display representing data to be transmitted with the FIR module.

10. The system of claim 9, wherein the configuration circuitry to enable the pulse amplitude modulation includes the configuration circuitry to disable a transmit equalization with the FIR module.

11. The system of claim 9, wherein the pulse amplitude modulation includes four level pulse amplitude modulation.

12. The system of claim 9, wherein the configuration circuitry to transition the FIR module between the first operational mode and the second operational mode includes the configuration circuitry to configure a conductive path between an input of the first latch circuitry and a contact for providing an invariant voltage level.

13. The system of claim 9, wherein the configuration circuitry to transition the FIR module between the first operational mode and the second operational mode includes the configuration circuitry to configure a conductive path between an output of the first latch circuitry and a contact for providing an invariant voltage level.

14. The system of claim 9, wherein the first latch circuitry includes a first latch and wherein the configuration circuitry to transition the FIR module between the first operational mode and the second operational mode includes the configuration circuitry to disable the first latch.

15. The system of claim 9, wherein the first selection circuitry includes an input sensor to detect one of the first signals, and wherein the configuration circuitry to transition the FIR module between the first operational mode and the second operational mode includes the configuration circuitry to disable the input sensor.

16. The system of claim 9, further comprising:
serializer circuitry coupled to the FIR module, the serializer circuitry to output bits of the first bit sequence to the first latch circuitry and to output bits of the second bit sequence to the second latch circuitry, the serializer circuitry including:
a first shift circuit to shift even bits of the third bit sequence; and
a second shift circuit to shift odd bits of the third bit sequence.

17. A method comprising:
detecting connection of a signal source to a finite impulse response (FIR) module including first selection circuitry and second selection circuitry; and
with an input signal from the signal source, transitioning the FIR module between a first operational mode wherein selection of a first input group of the first selection circuitry and selection of a second input group of the second selection circuitry are each enabled, and a second operational mode wherein selection of the first input group and selection of the second input group are each disabled;
wherein the first selection circuitry is configured to concurrently receive first signals from first latch circuitry of the FIR module and, based on the first signals, to select one of first input groups of the first selection circuitry and to output a first voltage identifier; and
wherein the second selection circuitry is configured to concurrently receive second signals from second latch circuitry of the FIR module and, based on the second signals, to select one of second input groups of the second selection circuitry and to output a second voltage identifier; and
wherein transitioning the FIR module between the first operational mode and the second operational mode includes enabling a pulse amplitude modulation with the FIR module in the second operational mode.

18. The method of claim 17, wherein enabling the pulse amplitude modulation includes disabling a transmit equalization with the FIR module.

19. The method of claim 17, wherein transitioning the FIR module between the first operational mode and the second operational mode includes configuring a conductive path between an input of the first latch circuitry and a contact for providing an invariant voltage level.

20. The method of claim 17, wherein transitioning the FIR module between the first operational mode and the second operational mode includes configuring a conductive path between an output of the first latch circuitry and a contact for providing an invariant voltage level.

21. The method of claim 17, wherein the first latch circuitry includes a first latch and wherein transitioning the FIR module between the first operational mode and the second operational mode includes disabling the first latch.

22. The method of claim 17, wherein the first selection circuitry includes an input sensor to detect one of the first signals, and wherein transitioning the FIR module between the first operational mode and the second operational mode includes disabling the input sensor.

23. A computer-readable storage medium having stored thereon instructions which, when executed by one or more processing units, cause the one or more processing units to perform a method comprising:
    detecting connection of a signal source to a finite impulse response (FIR) module including first selection circuitry and second selection circuitry; and
    with an input signal from the signal source, transitioning the FIR module between a first operational mode wherein selection of the first input group and selection of the second input group are each enabled, and a second operational mode wherein selection of the first input group and selection of the second input group are each disabled;
    wherein the first selection circuitry is configured to concurrently receive first signals from first latch circuitry of the FIR module and, based on the first signals, to select one of the first input groups and to output a first voltage identifier; and
    wherein the second selection circuitry is configured to concurrently receive second signals from second latch circuitry of the FIR module and, based on the second signals, to select one of the second input groups and to output a second voltage identifier; and
    wherein transitioning the FIR module between the first operational mode and the second operational mode includes enabling a pulse amplitude modulation with the FIR module in the second operational mode.

24. The computer-readable storage medium of claim 23, wherein enabling the pulse amplitude modulation includes disabling a transmit equalization with the FIR module.

25. The computer-readable storage medium of claim 23, wherein transitioning the FIR module between the first operational mode and the second operational mode includes configuring a conductive path between an input of the first latch circuitry and a contact for providing an invariant voltage level.

26. The computer-readable storage medium of claim 23, wherein transitioning the FIR module between the first operational mode and the second operational mode includes configuring a conductive path between an output of the first latch circuitry and a contact for providing an invariant voltage level.

* * * * *